United States Patent [19]

Aitken

[11] Patent Number: 5,099,130
[45] Date of Patent: Mar. 24, 1992

[54] APPARATUS AND METHODS RELATING TO SCANNING ION BEAMS

[75] Inventor: Derek Aitken, Surbiton, England
[73] Assignee: Superion Limited, Surbiton, England
[21] Appl. No.: 664,665
[22] Filed: Mar. 5, 1991

[30] Foreign Application Priority Data

Mar. 8, 1990 [GB] United Kingdom ............... 9005204

[51] Int. Cl.$^5$ .......................................... H01J 37/147
[52] U.S. Cl. ........................... 250/396 R; 250/398; 250/492.2; 250/492.3
[58] Field of Search ............. 250/492.2, 492.21, 492.3, 250/398, 396 R, 396 ML

[56] References Cited

U.S. PATENT DOCUMENTS

| | | | |
|---|---|---|---|
| 3,569,757 | 3/1971 | Brewer et al. | 250/396 R |
| 4,492,873 | 1/1983 | Dmitriev et al. | 250/396 ML |
| 4,578,589 | 3/1986 | Aitken | 250/492.2 |

Primary Examiner—Jack I. Berman
Attorney, Agent, or Firm—Cushman, Darby & Cushman

[57] ABSTRACT

A converter 26 for converting an angularly scanned ion beam 11 into a parallel scanned ion beam comprises first and second electrodes 27 and 28 positioned adjacent each other and shaped to follow concentric part-conical surfaces. The inner part-conical electrode 27 is at beam line potential and has an entry aperture 31 for receiving the ion beam, and an exit aperture 32 through which the beam exits after being bent through 90° by a potential difference across the electrodes 27 and 28. The entry beam 11 is angularly scanned by an electrostatic scanner positioned where the beam 11 passes the cone axis 33, the beam being scanned through paths lying along radii of the cone axis. The exit beam 11 emerges in a direction which is substantially parallel to the cone axis throughout the angular scanning of the entry beam.

18 Claims, 6 Drawing Sheets

APPARATUS AND METHODS RELATING TO SCANNING ION BEAMS

The present invention is concerned with apparatus and methods relating to scanning ion beams. In one aspect the invention relates to apparatus for and methods of converting an angularly scanned ion beam into a parallel scanned ion beam. The invention also relates to apparatus for and a method of producing a parallel scanned ion beam. The invention relates in particular, but not exclusively, to implanting ions of a preselected species, into a target element, for example the controlled introduction of a species into the surface layer of another material. The technique is important in semiconductor technology where it is used in the manufacture of integrated circuits and other devices, particularly by modifying the conductivity of semi-conductor material by introducing chemical impurities into the material. The general background to the use of ion implantation in the manufacture of large scale integrated circuit chips is set out in published U.S. Pat. No. 4,578,589, having the same inventor as the present application.

An ion implantation apparatus normally consists of an ion source, an extraction system having an extraction electrode which accelerates the ions from the extraction slot in the ion source, an analysing magnet for the selection of the required ion species, acceleration states before or after the analysing magnet, and a target region with means for producing relative scanning movement between the beam and the target, either by scanning the beam, or by moving the target.

Ion implantation at moderate beam currents (beam currents at which space charge is not a serious problem, for example approximately 1 mA or less) is usually carried out in machines which achieve uniformity over the implant area by scanning the beam in a similar manner to the electron beam scanning in a television tube. Typically a beam is deflected by an electrostatic scanner. As the beam passes through the electric field between the two scanner plates, it is deflected so that the beam spot on the target moves in a predetermined pattern in order to achieve a generally uniform implant. However, two difficulties arise with this technique. Firstly a uniform angular deflection of the beam does not produce uniform scanning on the surface of the target; there is a geometrical error. For a scan angle of 2° to 3°, this is not too serious. More serious is the change of angle between the beam direction and the target surface. This causes an angle dependent variation in the interaction of the incoming ion with the crystal lattice of a single crystal target such as a silicon wafer. The depth of penetration is dependent on a phenomenon called "channelling", which is the tendency for ions to have increased penetration when travelling parallel to low index crystal planes. This difficulty can be avoided by parallel scanning, that is to say scanning at a constant angle, usually a zero or 7° implant angle, between the ion beam and the surface of the target.

In previously known systems for achieving parallel beam scanning, the system acts to deflect the scanned beam twice, once to achieve the angular scanning, and a second time to produce an equal and opposite deflection to create a parallel scan parallel to the original beam direction. The main problem is that the second scanner must have an aperture larger than the required scan distance. This requires a large and expensive apparatus.

It is an object of the present invention to provide an improved apparatus for, and method of, producing a parallel scanned ion beam, utilising a relatively small and inexpensive apparatus and operating by simple steps.

According to the present invention there is provided apparatus for converting an angularly scanned ion beam into a parallel scanned ion beam, characterised by electrostatic deflection means for receiving an angularly scanned ion beam and for deflecting the ion beam in a plane transverse to the angular scanning of the beam to a direction which remains substantially constant throughout the angular scanning of the beam.

There is also provided in accordance with the present invention apparatus for producing a parallel scanned ion beam, comprising means for effecting angular scanning of an ion beam by varying the angle of the direction of the beam, characterised by electrostatic deflection means for deflecting the angularly scanned ion beam in a plane transverse to the angular scanning of the beam to a direction which remains constant throughout the scanning of the beam.

Preferably, although not essentially, the said plane transverse to the angular scanning of the beam is a plane at right angles to the angular scanning.

Preferably the electrostatic deflector means is arranged to receive the beam when angularly scanned in a first plane and to deflect the beam in a second plane perpendicular to the first plane, the electrostatic deflection means being arranged to deflect the ion beam through an angle of substantially 9°, to a direction which remains substantially perpendicular to the said first plane throughout the angular scanning of the beam.

Conveniently, the electrostatic deflection means has an electrode structure which is curved about an axis of symmetry, and the electrostatic deflection means is arranged to deflect the ion beam to a direction which is parallel to the axis of symmetry of the electrode structure.

Preferably the said curved electrode structure is shaped to follow a surface formed by rotation of a chosen figure about the said axis of symmetry. For example an electrode may be shaped to follow part of a conical surface formed by rotation about the said axis of a line inclined to the axis. In other arrangements, an electrode may be shaped to follow part of a spherical surface formed by rotation of a semi-circle about the axis, or a torroidal surface formed by rotation about the axis of a circle spaced from the axis.

According to the present invention in a further aspect there is provided apparatus for converting an angularly scanned ion beam into a parallel scanned ion beam, characterised by electrostatic deflection means having an electrode structure which is curved about an axis of symmetry and which is arranged to deflect the angularly scanned ion beam to a direction which is parallel to the axis of symmetry of the electrode structure throughout the scanning of the beam.

Although other arrangements are possible by appropriate variations in the voltage across the electrodes, it is most preferable for the electrostatic deflector means to be arranged to receive the ion beam along a path lying in a plane substantially perpendicular to the axis of symmetry. Preferably the electrostatic deflector means is arranged to receive the ion beam along a path passing through the axis of symmetry, and preferably the angular scanning of the beam is arranged to be effected by varying the angle of the direction of the beam at the region where the beam passes through the axis of symmetry.

In preferred forms of the apparatus, the angular scanning of the ion beam is arranged to be effected in a plane perpendicular to the said axis of symmetry. Preferably the electrostatic deflector means is arranged to deflect the ion beam through an angle (preferably but not essentially substantially 90°) which is constant throughout the angular scanning of the ion beam.

In a particularly preferred form, the deflection means comprises first and second electrodes positioned adjacent each other and shaped to follow concentric part-conical surfaces, the inner part-conical electrode having an entry aperture for receiving the angularly scanned ion beam, and an exit aperture for the ion beam, the entry and exit apertures being spaced apart in a plane containing the axis of symmetry of the concentric part-conical surfaces, and means for applying a potential difference across the electrodes such as to bend the angularly scanned ion beam entering through the first aperture so as to exit through the second aperture in a direction which is substantially parallel to the cone axis throughout the angular scanning of the entry beam.

Conveniently the electrodes are elongate in a direction transverse to the said plane containing the cone axis, and preferably each aperture in the inner electrode is also elongate in a direction transverse to the said plane.

Preferably the apparatus includes bias deflector means for producing a bias deflection of the beam before the beam enters the said electrostatic deflection means, the bias deflection being arranged to be constant in normal operation, the bias deflector means being coupled to means for applying a potential difference across electrodes of the electrostatic deflection means, in such a manner as to produce diversion of the ion beam away from the said electrostatic deflection means in the event of unwanted variation in the operating voltage across the electrodes.

It is to be noted that features which are set out hereinbefore or hereinafter with reference to apparatus according to the invention, may also be provided in relation to a method according to the invention, and vice versa.

In particular, there is provided in accordance with the invention a method of producing a parallel scanned ion beam, comprising angularly scanning an ion beam by varying the angle of the direction of the beam, and characterised by deflecting the ion beam in a plane transverse to the angular scanning of the beam to a direction which remains substantially constant throughout the angular scanning of the beam.

Embodiments of the invention will now be described by way of example with reference to the accompanying drawings in which.

Figure 4A:
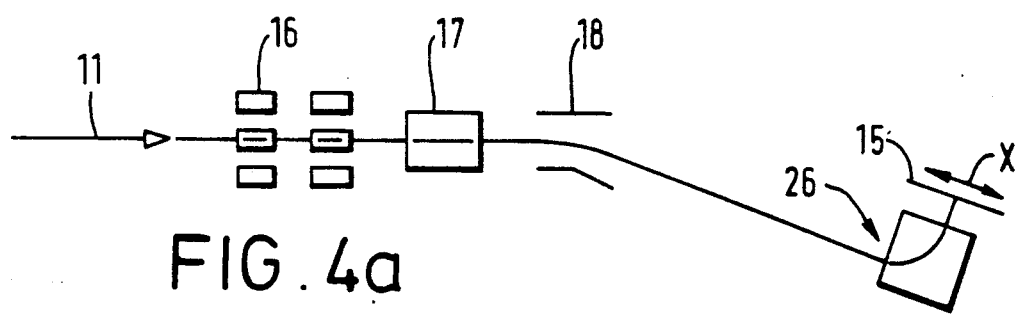
FIGS. 4a and 4b show diagrammatic plan and side views respectively of apparatus for producing a parallel scanned ion beam, embodying the invention.
Figure 4B:
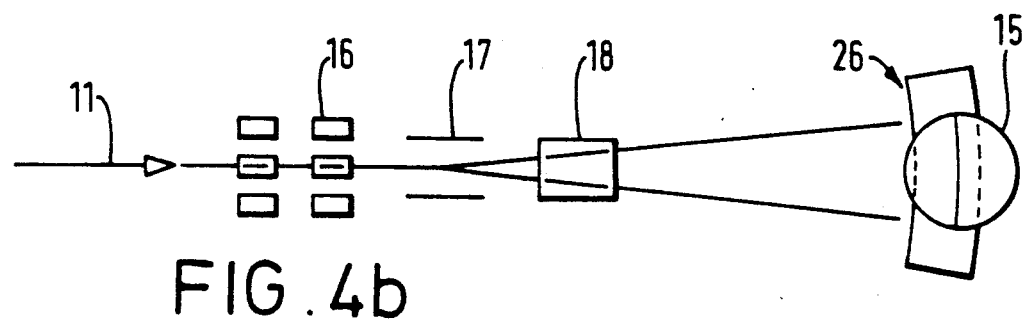
Figure 5:
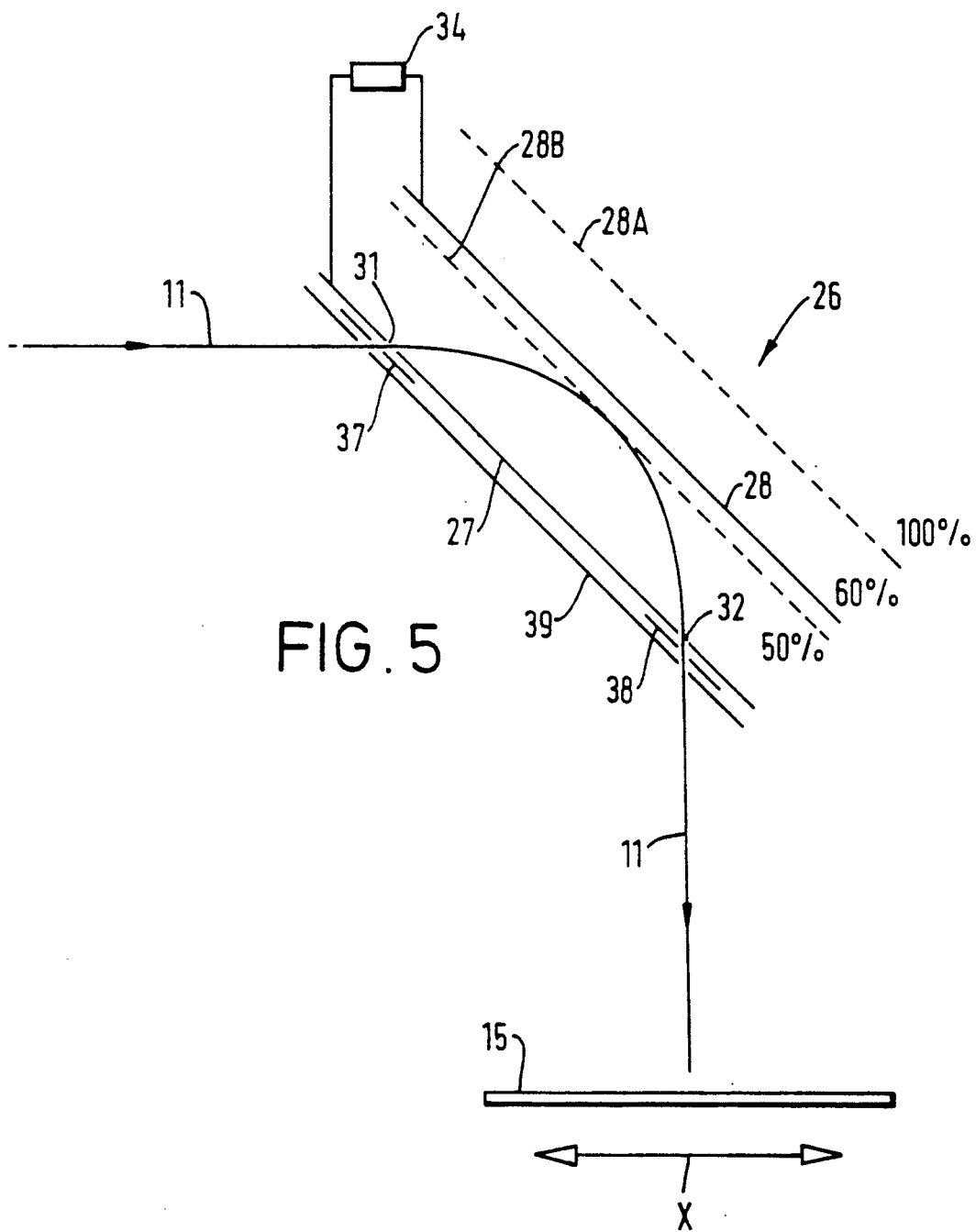
FIG. 5 is a diagrammatic plan view of apparatus for converting an angularly scanned ion beam into a parallel scanned ion beam, embodying the invention, and showing in detail a component shown in the apparatus of FIGS. 4a and 4b.
Figure 6A:
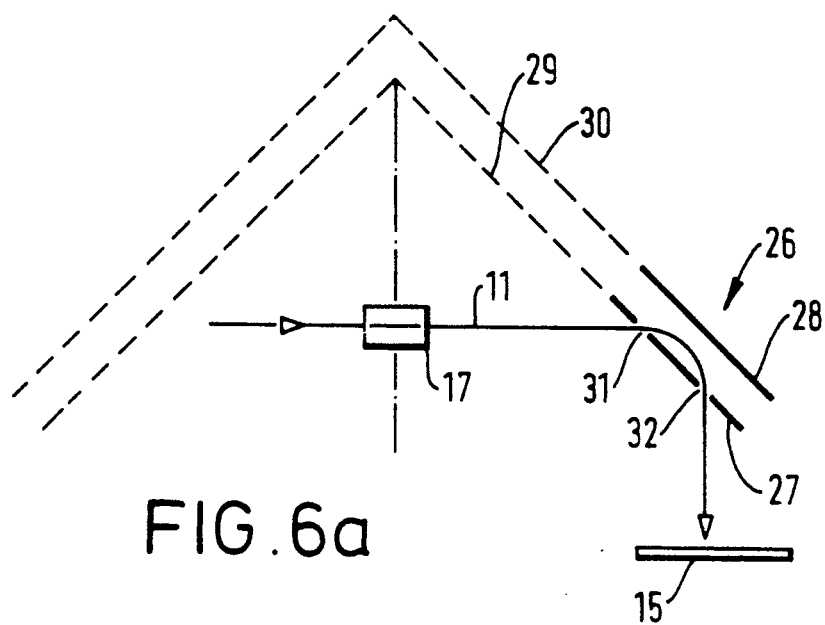
Figure 6B:
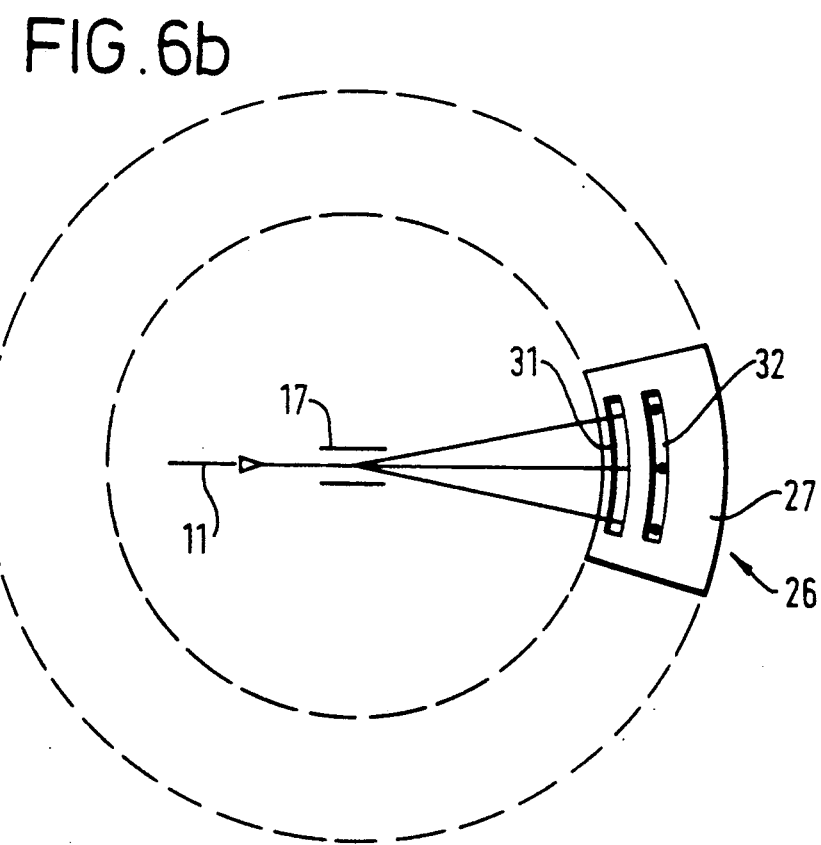
Figure 7:
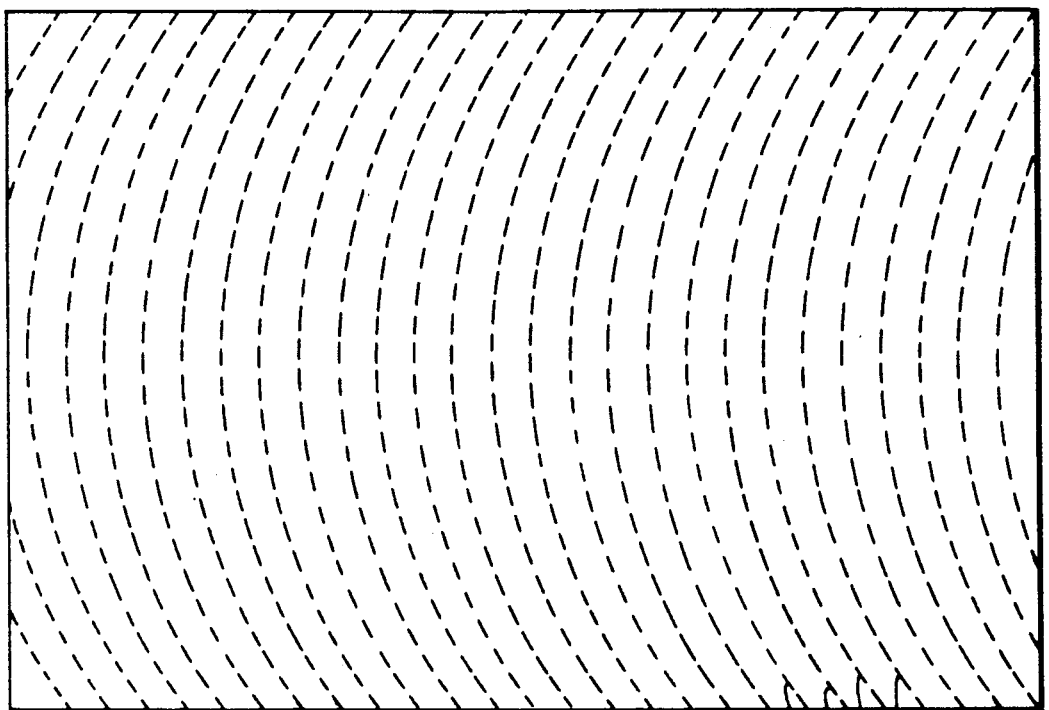
Figure 8A:
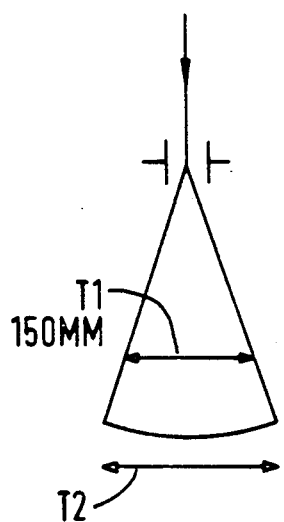
Figure 8B:
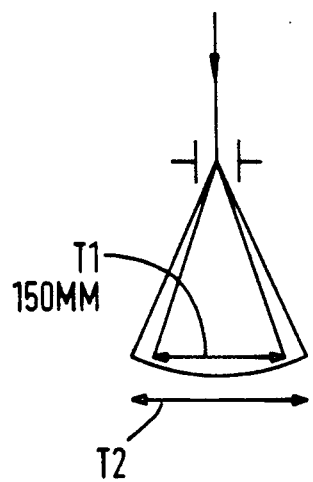
Figure 8C:
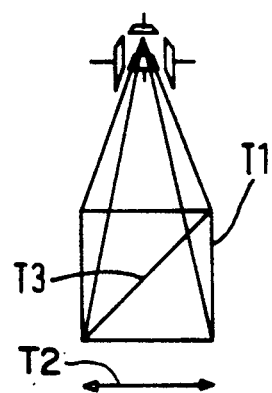
Figure 9A:
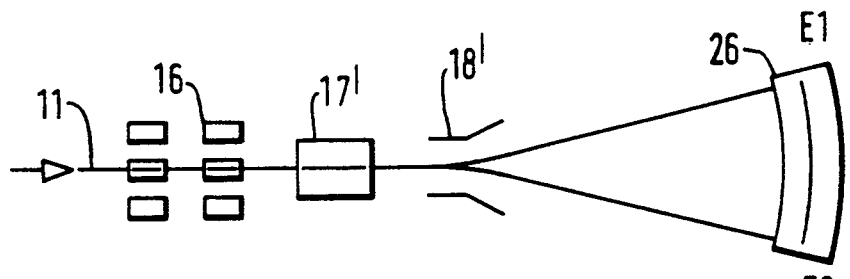
Figure 9B:
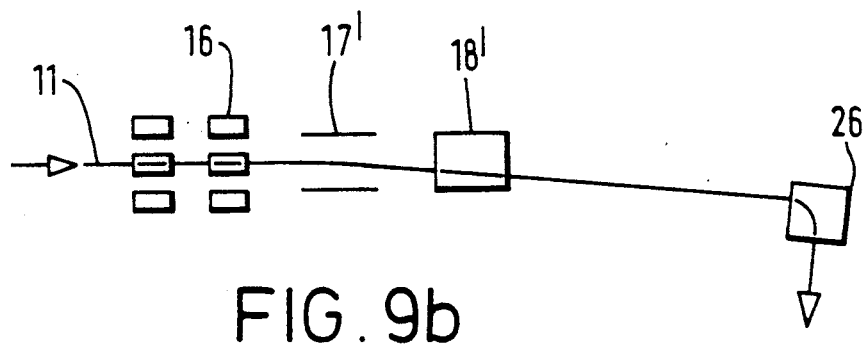
Figure 10A:
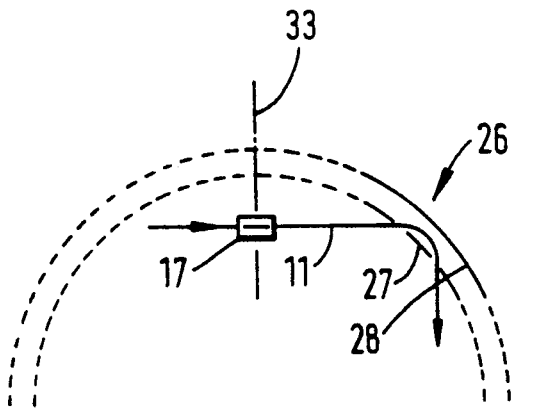
Figure 10B:
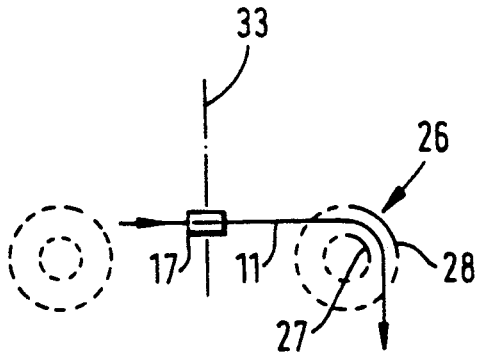

FIGS. 6a and 6b show in plan and side views respectively diagrammatic representations of two concentric conical surfaces which dictate the shapes of electrodes found in the apparatus shown in FIGS. 4a and 4b and 5, and which embody the invention;

FIG. 7 shows a scan pattern produced by apparatus such as shown in FIGS. 4a to 6b, and embodying the invention;

FIGS. 8a, 8b, and 8c show diagrammatic representations of three arrangements for increasing the size of a target which may be scanned by apparatus embodying the invention;

FIGS. 9a and 9b show diagrammatic plan and side views respectively of ion beam scanning apparatus, illustrating how a known apparatus can be converted into an apparatus embodying the invention; and FIGS. 10a and 10b show alternative forms of electrodes which may be used in apparatus for converting an angularly scanned beam to a parallel scanned beam, in modified forms of the apparatus shown in FIGS. 4a and 4b.

Figures 1A, 1B:
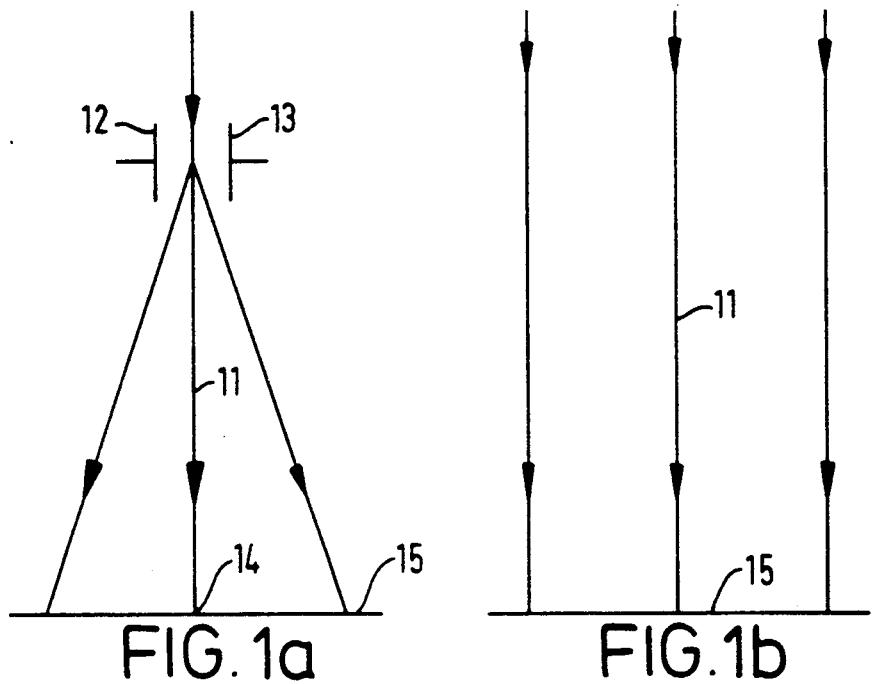
FIGS. 1a and 1b illustrate diagrammatically paths of ion beams in angular and parallel scan techniques.

FIG. 1a shows diagrammatically a conventional angularly scanned ion beam 11 passing between two scanner plates 12 and 13 which produce deflections so that the beam spot 14 moves in a predetermined pattern on a target 15 to achieve a uniform implant. If the voltage applied to the scanner plates 12 and 13 varies uniformly with time, a uniform beam scan speed across the target will be achieved. Usually two sets of scanner plates are used applying electric fields at right angles to each other, one only set being shown in FIG. 1a. By applying a uniform sawtooth voltage pattern to the scanner plates a continuous series of uniform passes of the beam over the target can be achieved. By applying a frequency of 10–100 Hz to the X-scanning plates and 1 kHz to the Y-scanning plates, an approximately uniform two dimensional implant can be achieved on the target surface.

Because of the resulting variation of implant angle at the edges of the scan produced by this system, as shown in FIG. 1a, there is an increasing requirement for parallel scanning which is illustrated diagrammatically in FIG. 1b. Here the beam 11 is scanned back and forth across the target 15, but is maintained perpendicular to or at a fixed angle (e.g. 7°) to the target 15 during the scanning.

Figure 2A:
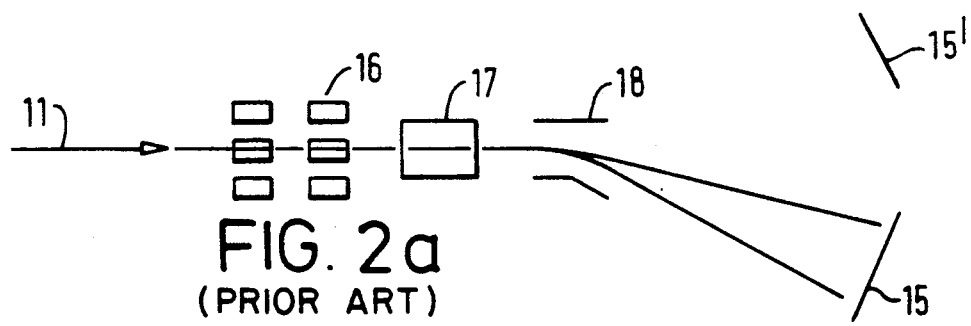
FIGS. 2a and 2b show diagrammatic plan and side views respectively of a known angular electrostatic scanning system.
Figure 2B:
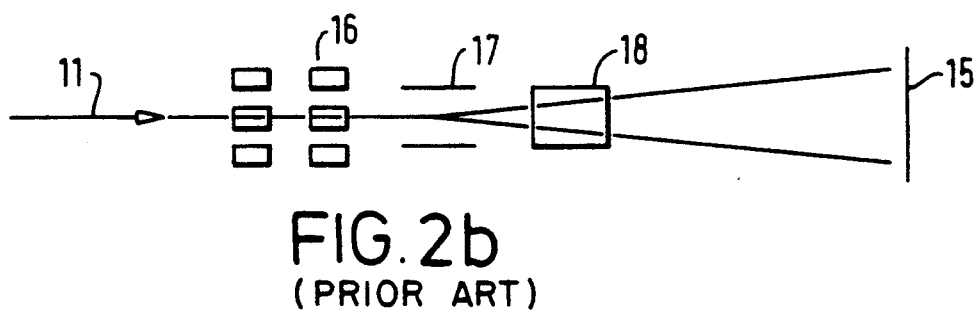

A typical conventional electrostatic scanning system is illustrated in FIGS. 2a and 2b, to produce angular scanning of the beam. A full energy, mass analysed, beam 11 passes through an electrostatic (or magnetic) quadrupole lens 16 to produce the required spot size on the target 15. The beam 11 then passes through a high frequency Y-scanner 17, giving the angular scan illustrated in FIG. 2b. The beam then passes through an X-scanner 18 which achieves an X-scan illustrated in FIG. 2a, and also produces an overall deflection, as illustrated in FIG. 2a. This constant deflection is incorporated to prevent neutralised ions (which would not be deflected by the scanners) from hitting the target in a single non-scanning position, which would produce undesired non-uniformity. The neutralised ions pass by the target 15 since they are not deflected by the X-scanner 18. The uniform deflection of the X-scanner 18 also enables a second (or further) end station to be provided, for example offset from the target 15 at a position 15' shown on the other side of the central axis of the apparatus. The X-scanner would then need to be provided with an alternative overall deflection, to which the beam could be switched when the other end station 15' was in use.

Figure 3A:
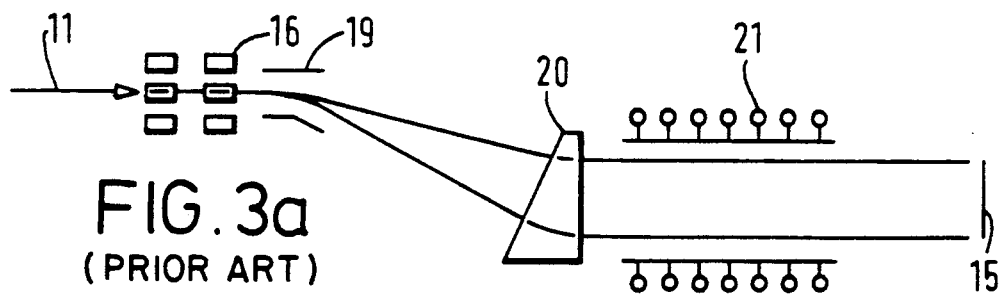
FIGS. 3a and 3b show diagrammatic plan views of two known systems for producing parallel scanning of an ion beam.

FIG. 3a shows in diagrammatic plan view a known apparatus for producing a parallel scanned ion beam. The beam 11 passing through the scanners is not at full energy; it is accelerated to full energy after the scanning stage. The beam first passes through a magnetic quadrupole lens 16 and then through an electrostatic deflector 19 which produces the Y-scan and also produces a constant deflection to avoid the neutralised ions striking the target. The beam then passes through a magnetic, constant-field, dipole lens 20 arranged with the first scanner 19 at its focal point. The dipole lens 20 compensates for the angular scanning and produces a parallel scanned beam, which passes through an acceleration system 21 which accelerates the scanned beam before it strikes the target 15.

The disadvantages of this system are (i) the electrostatic deflector acts on a low energy beam, exacerbating space charge issues; (ii) the low energy scan is necessary to avoid an excessively large dipole magnet; and (iii) a large post-acceleration system is necessary to handle the parallel scanned beam.

Figure 3B:
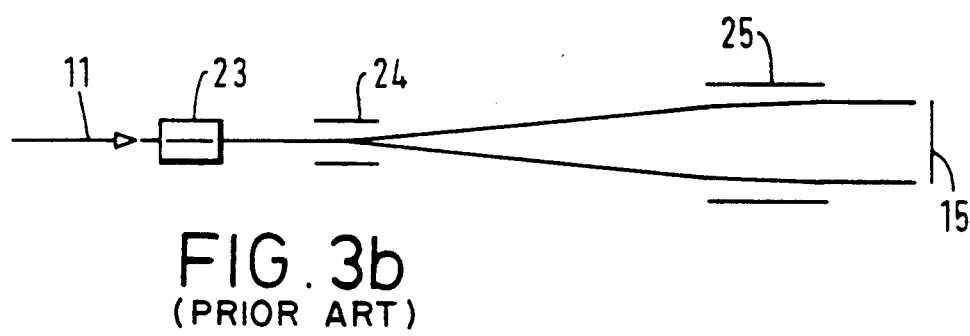

FIG. 3b shows diagrammatically in plan view an alternative known system for producing parallel scanning. Here the beam 11 passes through a DC electrostatic deflector 23, acting as a neutral trap. The beam then passes through a multipole electrostatic deflector 24 which produces an angular scan as shown. Next the beam passes through a second multipole deflector 25 to compensate for the angular scanning and to give a parallel scan of the beam which finally strikes the target 15.

The main disadvantage of this system is the large aperture which is required for the last scanner 25. This requires either large voltages or a large physical size. Both the machines shown in FIGS. 3a and 3b are large and expensive.

FIGS. 4a and 4b show in plan and side view respectively, apparatus for producing a parallel scanned ion beam, embodying the invention. Many of the components shown are common to the conventional, electrostatic, angular scanning system shown in FIGS. 2a and 2b and are indicated by like reference numerals. This commonality of many components provides a significant advantage of embodiments of the invention, since it allows conversion of conventional scanning machines to the system of the invention. Thus the ion beam 11 passes through components 16, 17 and 18 to produce an angularly scanned beam, as has been described with reference to FIGS. 2a and 2b, except that no X scan is provided. The angularly scanned beam is then fed to a converter indicated generally at 26, for converting the angularly scanned ion beam into a parallel scanned ion beam, in accordance with the present invention. The exit beam then strikes the target 15.

The converter 26 is shown in more detail in FIGS. 5 and 6a and 6b. The converter 26 comprises first and second electrodes 27 and 28 positioned in register with each other and shaped to follow concentric part conical surfaces. Referring to FIG. 6a, the first, inner electrode 27 follows part of a conical surface 29 and the second outer electrode 28 follows part of a conical surface 30.

As shown in FIG. 5, the inner electrode 27 has an entry aperture 31 for receiving the ion beam 11, and has an exit aperture 32 through which the ion beam 11 exits. The entry and exit apertures 31 and 32 are spaced apart in the plane of the paper of FIG. 5, which is a plane containing the cone axis 33 of the concentric conical surfaces 29 and 30, as shown in FIG. 6a. In FIG. 5 there is shown diagrammatically means 34 for applying a potential difference across the electrodes 27 and 28 such as to bend the ion beam 11 through 90°, to emerge through the exit aperture 32. As shown in FIG. 6a, the entry beam 11 is directed to the electrodes 27 and 28 along a path lying in a plane perpendicular to the cone axis 33 and passing through that axis. The beam 11 then emerges through the exit aperture 32 in a direction which is parallel to the cone axis 33. As shown in FIG. 6b, the angular scanning of the entry beam 11 is produced by having the electrostatic scanner 17 at the cone axis 33, where the ion beam crosses the cone axis. The angular scanning is effected in the plane of the paper of FIG. 6b, perpendicular to the cone axis 33, with the beam being scanned through paths lying along radii of the cone axis 33.

The effect of this scanning arrangement is that, throughout the angular scanning of the entry beam 11, the exit beam 11 emerges parallel to the cone axis 33.

In this embodiment of the invention, the X-scanner 18 is arranged only to produce a constant deflection and not an X scan function. In addition to providing a conventional neutral trap, the X-scanner 18 can serve two other functions. A first additional function is to prevent ions of an incorrect energy entering the electrostatic mirror (for example due to charge exchange or electrical breakdown in one of the acceleration systems). A second additional function of the X-scanner can be arranged to be the deflection of the ion beam away from the electrostatic mirror in the event of breakdown of the potential difference across the mirror electrodes. A particularly advantageous practical embodiment uses the mirror voltage to provide (or to indirectly influence) the neutral trap, deflection voltage across the X-scanner electrodes 18. If a breakdown occurs in the mirror and the mirror voltage reduces or disappears, then it is desirable to aid recovery by not transmitting the beam into the mirror (which would otherwise result in the beam hitting the mirror electrode). With the proposed link between the mirror voltage and the neutral trap voltage, the consequent change in neutral trap, deflection angle, prevents transmission into the mirror during breakdown. The X-scan of the target 15 is produced by a mechanical slow scan of the target 15 moving relative to the beam 11 as indicated by the arrow X in FIG. 5.

The assembly of electrodes in the converter 26 includes, as shown in FIG. 5, suppression electrodes 37 and 38 and a screen 39. The electrode assembly forms a device referred to as an electrostatic mirror.

The position of the second, outer electrode 28, may be varied, the position being determined by the mirror voltage as a percentage of the total acceleration voltage of the beam 11. The outer electrode 28 is shown in full lines at a position suitable for operation at a voltage such as to give a potential difference across the electrodes of 60 percent of the total acceleration voltage applied to the beam 11. In dotted lines, the second electrode is shown at an inner position 28B where it can be operated at a voltage 50 percent of the acceleration voltage of the beam, and at an outer position 28A where it can be operated at a voltage 100 percent of the total acceleration voltage.

The second, outer electrode 28 is referred to as the mirror electrode and, as mentioned, is conveniently set at a percentage of the source potential. For example when set at the 100 percent position indicated at 28A the mirror voltage would be equal to the total accelerating voltage of the beam 11, i.e. at source potential. Where a 90° turn of the beam 11 is required, the minimum mirror voltage is 50 percent. At this voltage the beam just touches the mirror electrode 28B tangentially. This is undesirable, so in operation a minimum mirror voltage is approximately 60 percent. As far as the beam 11 is concerned, it is the electric gradient that matters, not the mirror voltage.

A number of advantages arise from the invention, at least in preferred embodiments thereof. As has been mentioned, the converter 26 can easily be retrofitted to existing machines. Another advantage in the embodiment described is that the beam 11 always enters the mirror electrode assembly through the electrode 27 at beam line potential. This is not true with a conventional second scanner in an arrangement such as shown in FIG. 3b.

The embodiment shown can easily be increased in scale. Only the length of the mirror electrode assembly determines the maximum target size. This can easily be achieved by increasing the scan angle to achieve the required target size capability. The electric gradient distance across the electrodes 27 and 28 does not need to change with increase of scale, as it would with a conventional electrostatic second scanner. A long electric gradient is disadvantageous because it means that high AC voltages are needed to achieve a particular gradient.

Further advantages are that the converter 26 uses only a DC voltage which is simple and less prone to breakdown than an AC device. The device acts as an energy filter, and the overall device is compact so that the target can be placed close to the mirror electrode assembly.

FIG. 7 shows diagrammatically the scan pattern produced on the target 15, illustrated by scan lines 40. As with conventional scanning, a scan speed correction is necessary at high scan angles. In this case the scan lines get closer together (for constant radius scan lines) as the distance from the symmetry axis increases.

The present invention is particularly advantageous in allowing modification of existing conventional scan machine designs, for example to convert them from 125 mm-150 mm conventional scan capability, to 200 mm parallel scan. It is noticeable that the parallel scan machines now available are large and expensive, so that the extension of existing technology to parallel scan by retrofit conversion is commercially very attractive.

FIGS. 8 and 9 illustrate aspects of the conversion of existing machines. In FIG. 8a it is shown that the target width indicated at T1 can easily be increased to that shown at T2 (for example from 150 mm to 200 mm) by increasing the beam line length. Because of the conversion to parallel scanning provided by the present invention, this provides an acceptable result. Similarly, as shown in FIG. 8b, the target size can be increased from T1 to T2 by the alternative of increasing the scan angle. Distortion is kept at acceptable levels by use of the present invention. Finally, in FIG. 8c, an increase in target size from T1 to T3 can be achieved by using a diagonal scan produced by applying the same saw-tooth voltage to both X and Y scanners.

FIG. 9a shows in plan view a conventional angular scan system of the kind shown and described in FIG. 2a, but here shown converted to the present invention. Before conversion, the X-scanner shown in FIG. 9a would have included a constant deflection to one side or other of the central axis of the apparatus, giving two end stations indicated at E1 and E2. In the conversion shown, the Y-scanner 17' is required only to produce a constant deflection as shown in FIG. 9b, to provide a neutral trap. The angular scanning of the beam is then produced by the X-scanners 18' and the scanned beam 11 is fed to a converter 26 such as has been described hereinbefore. Thus the conventional system is easily converted into a parallel scanned system embodying the invention.

The term "electrostatic mirror" has been used as the preferred practical example of deflection by electrostatic means, it being the general case involving both deflection and deceleration and acceleration of the charged particle beam. The conventional electrostatic mirror type of geometry, but in the form of conical rather than planar electrodes (as shown in FIG. 5), is probably the best solution to the requirement of a 90° deflection to a direction parallel to the axis of symmetry of the electrode geometry.

Many other variants are possible. Variously shaped electrostatic mirrors can be used in order to change the focusing properties. FIG. 10a shows the use of electrodes 27, 28 i.e. curved in a plane containing the axis of symmetry 33 of the electrode structure. This approach can provide a variety of types of curved electrode surface e.g. a sphere, ellipsoid, paraboloid or, as in FIG. 10b, a toroid. The latter example represents conventional electrostatic deflection with a 90° deflection to a direction parallel to the axis of the toroidal electrodes.

An electrostatic mirror involves deflection and deceleration/acceleration of the ion (or any charged particle) beam, whereas electrostatic deflection only involves deflection. A mirror is therefore a more effective way of achieving deflection because a substantial part of the deflection is achieved at a reduced energy. This reduces the size of the system and/or the strength of the voltage gradient necessary to achieve the required deflection. The most attractive practical implementation is to use two conical electrodes to form a conical electrostatic mirror

I claim:

1. Apparatus for converting an angularly scanned ion beam into a parallel scanned ion beam, comprising electrostatic deflection means for receiving an angularly scanned ion beam and for deflecting the ion beam in a plane transverse to the angular scanning of the beam to a direction which remains substantially constant throughout the angular scanning of the beam.

2. Apparatus according to claim 1 in which the electrostatic deflector means is arranged to receive the beam when angularly scanned in a first plane and to deflect the beam in a second plane perpendicular to the first plane, the electrostatic deflection means being arranged to deflect the ion beam through an angle of substantially 90°, to a direction which remains substantially perpendicular to the said first plane throughout the angular scanning of the beam.

3. Apparatus according to claim 1 in which the electrostatic deflection means has an electrode structure which is curved about an axis of symmetry, and the electrostatic deflection means is arranged to deflect the ion beam to a direction which is parallel to the axis of symmetry of the electrode structure.

4. Apparatus according to claim 3 in which the electrostatic deflection means is arranged to receive the ion beam along a path lying in a plane substantially perpendicular to the axis of symmetry.

5. Apparatus according to claim 3 in which the electrostatic deflection means is arranged to receive the ion beam along a path passing through the axis of symmetry.

6. Apparatus according to claim 5 in which the angular scanning of the beam is arranged to be effected by varying the angle of the direction of the beam at the region where the beam passes through the axis of symmetry.

7. Apparatus according to claim 6 in which the angular scanning of the ion beam is arranged to be effected in a plane perpendicular to the axis of symmetry.

8. Apparatus according to claim 1 in which the deflection means comprises first and second electrodes positioned adjacent each other and shaped to follow concentric part-conical surfaces, the inner part-conical electrode having an entry aperture for receiving the angularly scanned ion beam, and an exit aperture for the ion beam, the entry and exit apertures being spaced apart in a plane containing the axis of symmetry of the concentric part-conical surfaces, and means for applying a potential difference across the electrodes such as to bend the angularly scanned ion beam entering through the first aperture so as to exit through the second aperture in a direction which is substantially parallel to the cone axis throughout the angular scanning of the entry beam.

9. Apparatus according to claim 8 in which the electrodes and the apertures in the inner electrode, are elongate in a direction transverse to the said plane containing the cone axis.

10. Apparatus according to claim 1 including bias deflector means for producing a bias deflection of the beam before the beam enters the said electrostatic deflection means, the bias deflection being arranged to be constant in normal operation, the bias deflector means being coupled to means for applying a potential difference across electrodes of the electrostatic deflection means, in such a manner as to produce diversion of the ion beam away from the said electrostatic deflection means in the event of unwanted variation in the operating voltage across the electrodes.

11. Apparatus for producing a parallel scanned ion beam, comprising means for effecting angular scanning of an ion beam by varying the angle of the direction of the beam, and electrostatic deflection means for deflecting the angularly scanned ion beam in a plane transverse to the angular scanning of the beam to a direction which remains constant throughout the scanning of the beam.

12. A method of producing a parallel scanned ion beam, comprising angularly scanning an ion beam by varying the angle of the direction of the beam, and deflecting the ion beam in a plane transverse to the angular scanning of the beam to a direction which remains substantially constant throughout the angular scanning of the beam.

13. A method according to claim 12 including angularly scanning the ion beam in a first plane, and deflecting the ion beam in a second plane which is perpendicular to the first plane, through an angle of substantially 90° to a direction which remains substantially perpendicular to the first plane throughout the angular scanning of the beam.

14. A method according to claim 12 including effecting the said deflection of the ion beam by electrostatic deflection means having an electrode structure which is curved about an axis of symmetry, and deflecting the ion beam to a direction which is parallel to the axis of symmetry of the electrode structure.

15. A method according to claim 14 including directing the ion beam along a path lying in a plane substantially perpendicular to the axis of symmetry.

16. A method according to claim 14 including directing the ion beam along a path passing through the axis of symmetry.

17. A method according to claim 16 including effecting the angular scanning of the beam by varying the angle of the direction of the beam at the region where the beam passes through the axis of symmetry.

18. A method according to claim 17 including effecting the angular scanning of the beam in a plane perpendicular to the axis of symmetry.

* * * * *